United States Patent [19]

Savoye et al.

[11] Patent Number: 5,760,431

[45] Date of Patent: Jun. 2, 1998

[54] MULTIDIRECTIONAL TRANSFER CHARGE-COUPLED DEVICE

[75] Inventors: Eugene D. Savoye, Concord; Barry E. Burke, Lexington; John Tonry, Lincoln, all of Mass.

[73] Assignee: Massachusetts Institute of Technology, Cambridge, Mass.

[21] Appl. No.: 708,610

[22] Filed: Sep. 5, 1996

Related U.S. Application Data

[63] Continuation of Ser. No. 563,983, Nov. 29, 1995, abandoned.

[51] Int. Cl.$^6$ .................... H01L 27/148; H01L 29/768
[52] U.S. Cl. .................... 257/240; 257/241; 257/249
[58] Field of Search .................... 257/240, 241, 257/249

[56] References Cited

U.S. PATENT DOCUMENTS

| | | |
|---|---|---|
| 3,934,261 | 1/1976 | Sequin . |
| 4,051,505 | 9/1977 | Krambeck et al. . |
| 4,237,389 | 12/1980 | Allen . |
| 4,242,692 | 12/1980 | Hagiwara . |
| 4,349,749 | 9/1982 | Pfleiderer et al. . |
| 5,075,747 | 12/1991 | Kanbe . |
| 5,155,597 | 10/1992 | Lareau et al. . |
| 5,210,433 | 5/1993 | Ohsawa et al. . |
| 5,241,377 | 8/1993 | Kaneda . |
| 5,272,537 | 12/1993 | Watanabe . |
| 5,291,294 | 3/1994 | Hirota . |
| 5,306,906 | 4/1994 | Aoki et al. . |

FOREIGN PATENT DOCUMENTS

| | | |
|---|---|---|
| 0095725 A1 | 12/1983 | European Pat. Off. . |
| 0420764 A2 | 4/1991 | European Pat. Off. . |
| 0504852 A1 | 9/1992 | European Pat. Off. . |

OTHER PUBLICATIONS

IEEE Journal of Solid-State Circuits, vol. SC-14, No. 6, Dec., 1979, "An Analog CCD Reformatting Memory Employing Two-Dimensional Charge Transfer" by Robert J. Kansy.

IEEE Transactions on Electron Devices, vol. 41, No. 16, Dec. 1994, "An Orthogonal-Transfer CCD Imager" by B. E. Burke, R. K. Reich, E. D. Savoye and J. L. Tonry.

IEEE Journal of Solid-State Circuits, vol. SC-9, No. 3, Jun. 1974, "Two-Dimensional Charge-Transfer Arrays" by Carlo H. Séquin.

*Primary Examiner*—Ngân V. Ngô
*Attorney, Agent, or Firm*—Samuels, Gauthier, Stevens & Reppert

[57] ABSTRACT

A multidirectional charge transfer device configured in a charge storage medium. The device includes an array of charge storage regions. Each of said charge storage regions includes a plurality of first gates, each of which is arranged in a first portion of each charge storage region, a plurality of second gates, each of which is arranged in a second portion of each charge storage region, a plurality of third gates, each of which is arranged in a third portion of each charge storage region, and a plurality of fourth gates, each of which is arranged in a fourth portion of each charge storage region. The plurality of gates and charge storage regions are configured to define at least three bidirectional charge transfer paths which are noncollinear with respect to each other. The plurality of gates are sequentially biased to establish charge transfer along one of said bidirectional charge transfer paths and forming blocking potentials to charge transfer in the remaining charge transfer paths.

20 Claims, 18 Drawing Sheets

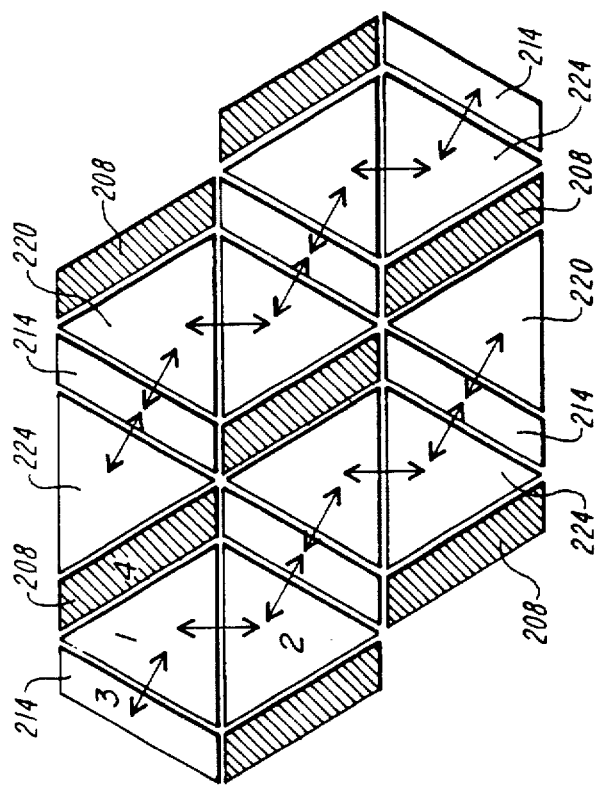
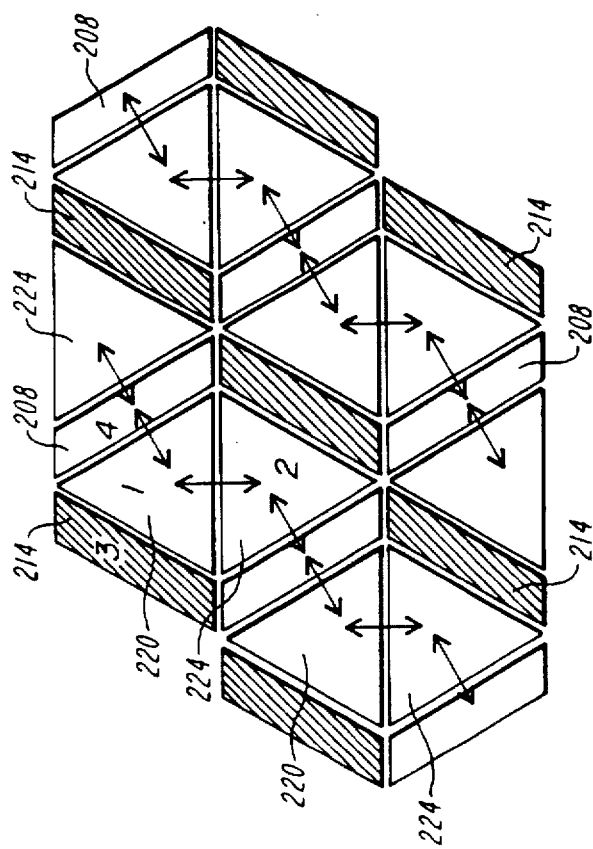

MULTIDIRECTIONAL TRANSFER CHARGE-COUPLED DEVICE

This is a continuation of application Ser. No. 08/563,983, filed Nov. 29, 1995, now abandoned.

BACKGROUND OF THE INVENTION

The invention relates to a multidirectional transfer charge-coupled device (CCD) which is capable of transferring charge packets in more than four directions.

Conventional imaging devices utilizing CCDs, though two-dimensional (2D) in structure, at best are capable of only transferring a charge-packet array along a single dimension. A CCD which can transfer charge in all four or more directions could find use in imaging applications where the charge would be shifted to track a moving image and thereby eliminate blur.

Sequin, "Two-dimensional Charge-transfer Arrays", IEEE J. Solid-State Circuits, vol.SC-9, pp.134–142, June 1974, describe a structure capable of 2D transfer, which could be made in three levels having submicron gaps therebetween. In a preferred embodiment, the submicron gap requirement is eliminated with a device having five clock phases, and which is realized with five conductor levels. From a fabrication standpoint of view, the described five level device has the virtue of being immune to intralevel gate-gate shorts, but has the drawback of requiring more conductor levels. Furthermore, the device requires gates for separate clock phases to be fabricated on the same conductor level (therefore leaving it vulnerable to intralevel shorts), and in addition requires the necessary gates to be closely abutted. For good charge transfer, the gap between the gates must be less than 1 μm, and this exacerbates the susceptibility of the described structure to intralevel shorts. A similar related device is described in U.S. Pat. No. 4,051,505 issued to Krambeck et al.

Other conventional 2D-transfer CCDs are described by Kansy et al., "An Analog CCD Reformatting Memory Employing Two-dimensional Charge Transfer", IEEE J. Solid-State Circuits, vol.SC-14, pp.1041–1048, December 1979, and in U.S. Pat. No. 5,291,294 issued to Hirota. The described devices allow for transfer in each of two orthogonal directions.

SUMMARY OF THE INVENTION

It is therefore an object of the present invention to provide a multidirectional transfer CCD structure that is capable of transferring charge in four or more directions.

It is a further object of the present invention to provide an multidirectional transfer CCD which is implemented as a four-phase device in four conductor levels, thus featuring immunity to intralevel shorts being able to be applied to large-area devices with the prospect of high yields.

Accordingly, the present invention provides a multidirectional charge transfer device configured in a charge storage medium. The device includes an array of charge storage regions. Each of said charge storage regions includes a plurality of first gates, each of which is arranged in a first portion of each charge storage region, a plurality of second gates, each of which is arranged in a second portion of each charge storage region, a plurality of third gates, each of which is arranged in a third portion of each charge storage region, and a plurality of fourth gates, each of which is arranged in a fourth portion of each charge storage region. The plurality of gates and charge storage regions are configured to define at least three bidirectional charge transfer paths which are noncollinear with respect to each other. The plurality of gates are sequentially biased to establish charge transfer along one of said bidirectional charge transfer paths and forming blocking potentials to charge transfer in the remaining charge transfer paths.

BRIEF DESCRIPTION OF THE ILLUSTRATED EMBODIMENTS

Figure 5B:
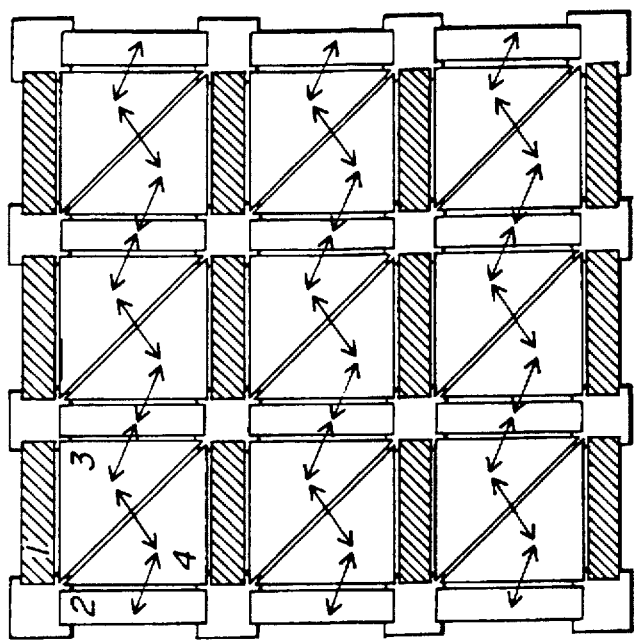
Figure 5A:
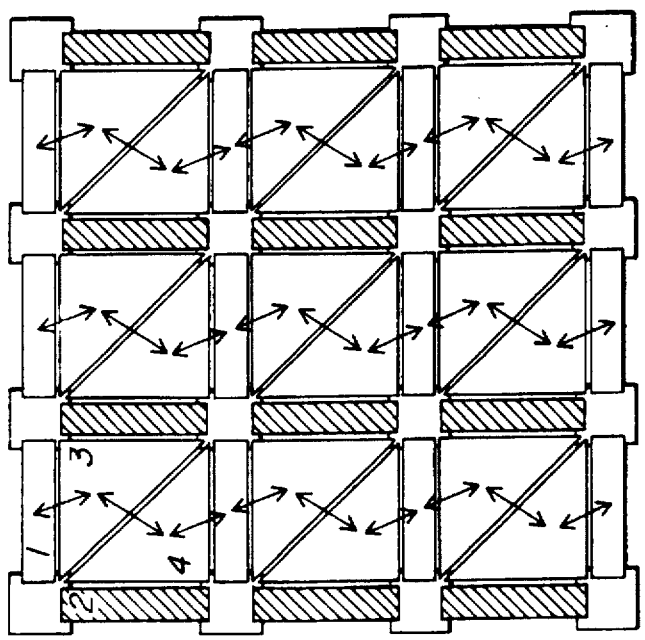
Figure 5C:
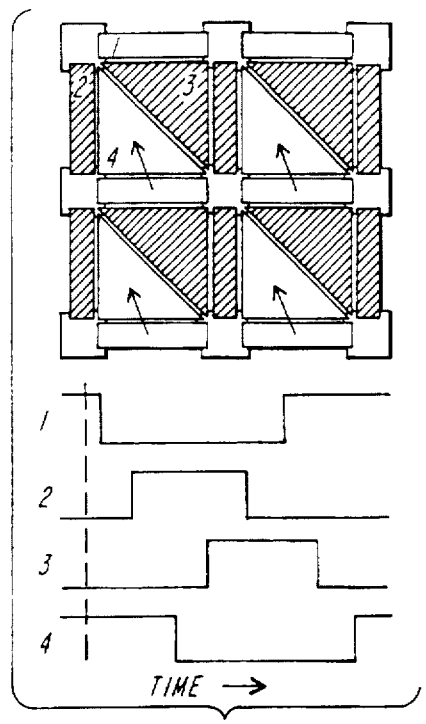
Figure 5D:
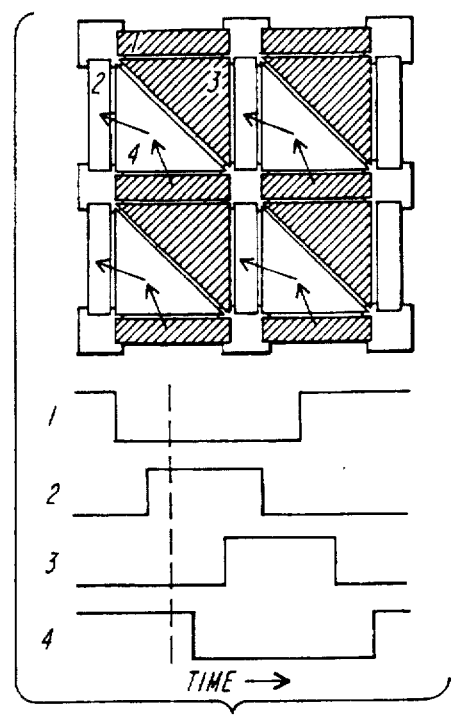
Figure 5E:
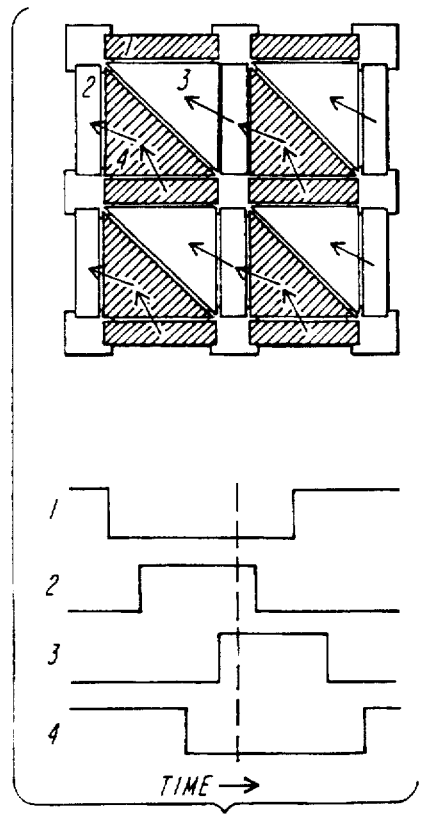
Figure 5F:
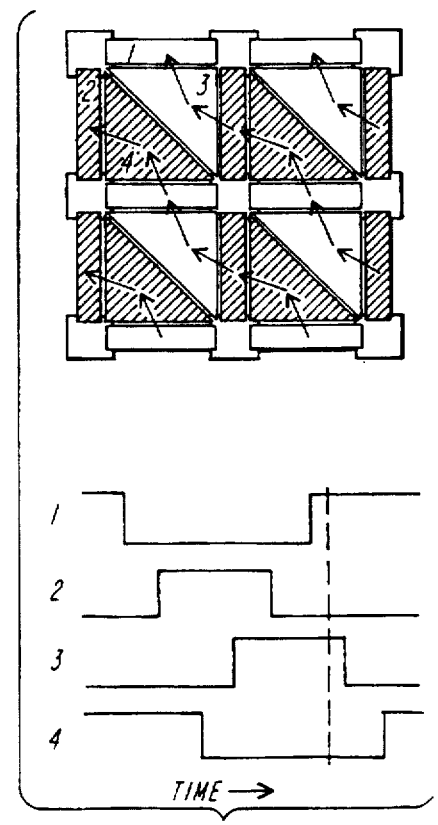
Figure 6:
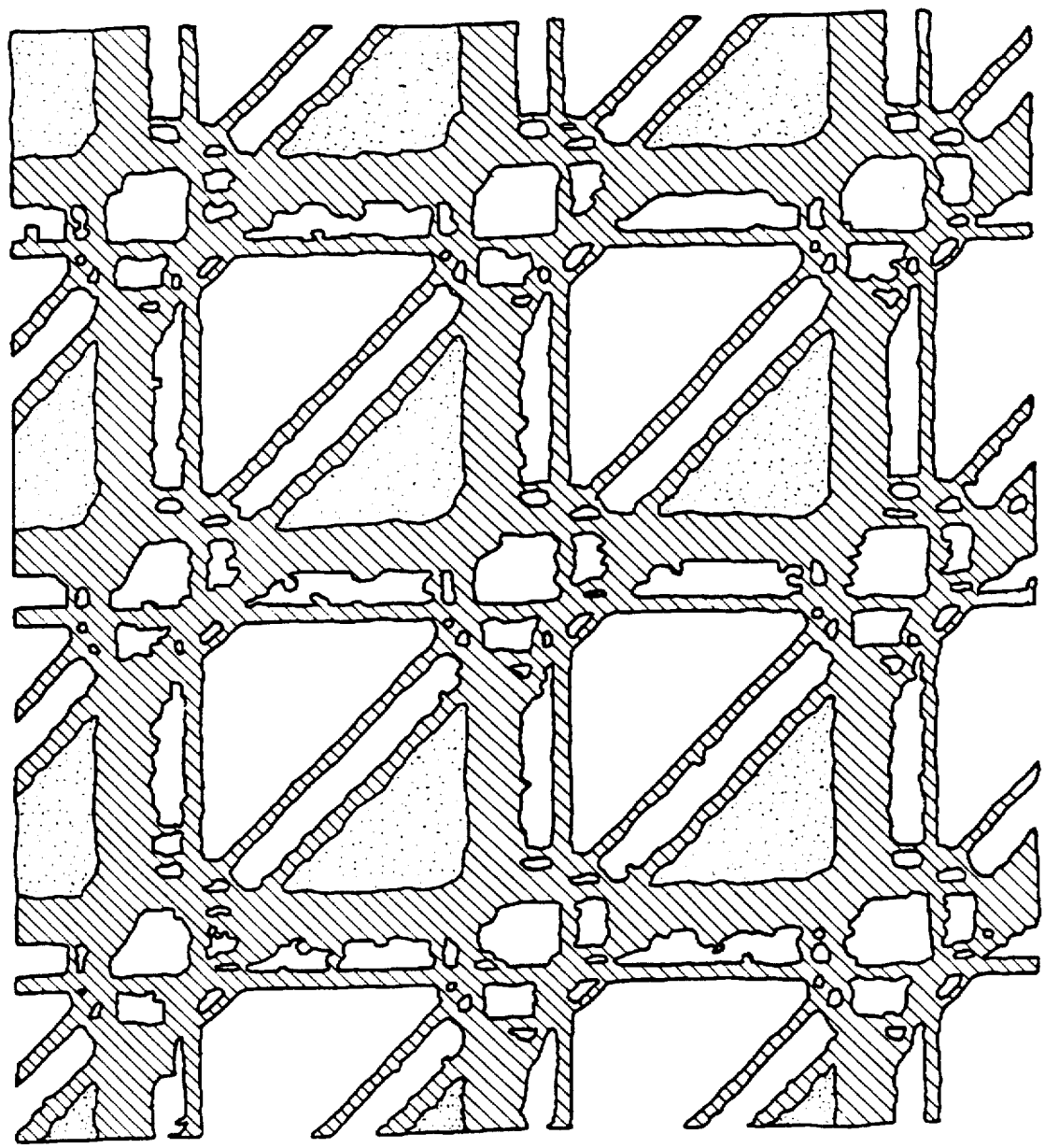
Figure 7:
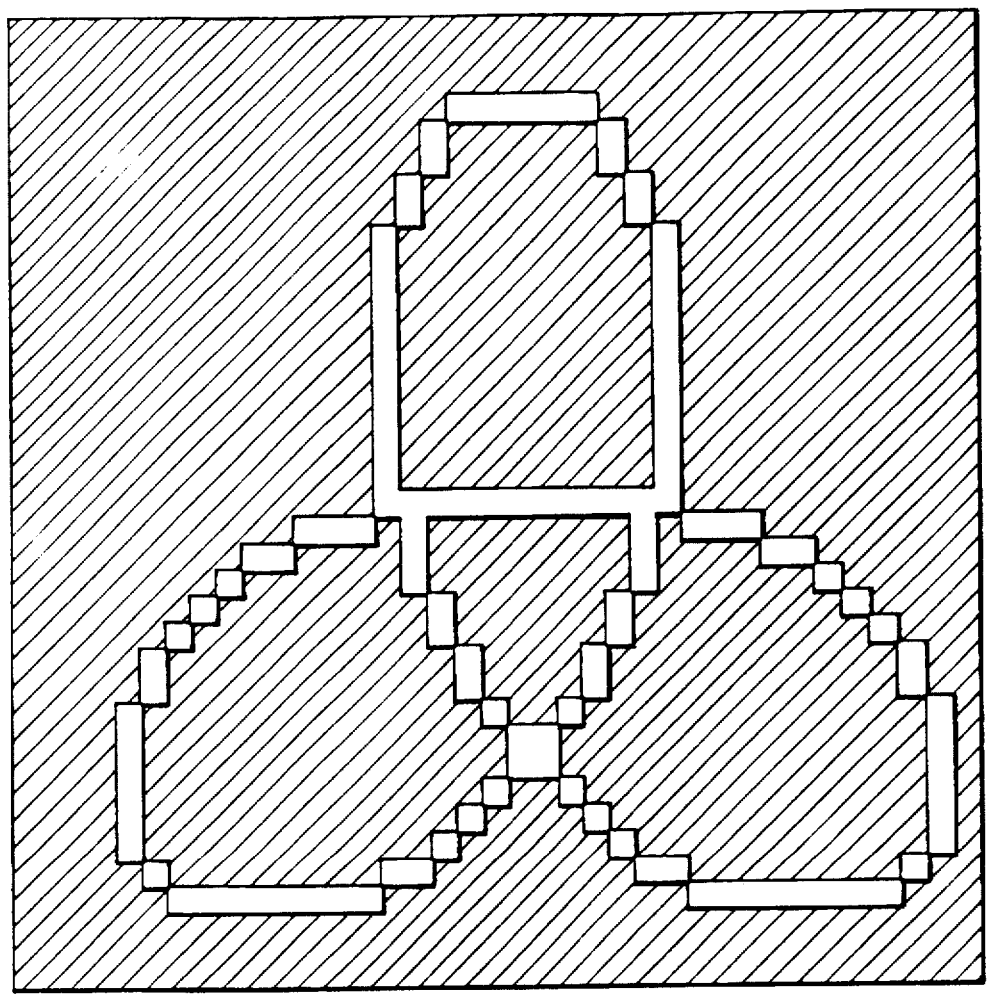

FIGS. 5A and 5B respectively show diagrammatic clocking representations of charge movement along a vertical bidirectional channel and a horizontal bidirectional channel of the present invention; FIGS. 5C–5F show diagrammatic clocking representations and associated timing diagrams for clocking the charge along a third bidirectional channel which is configured at a 45° diagonal;

FIG. 6 shows a photomicrograph of a portion of a multidirectional transfer CCD of the present invention as implemented in an exemplary pixel cell array;

FIG. 7 shows the imaging results on an exemplary test in which a laser was focused within a pixel cell near the center of the pixel cell array of FIG. 3.

Figure 8:
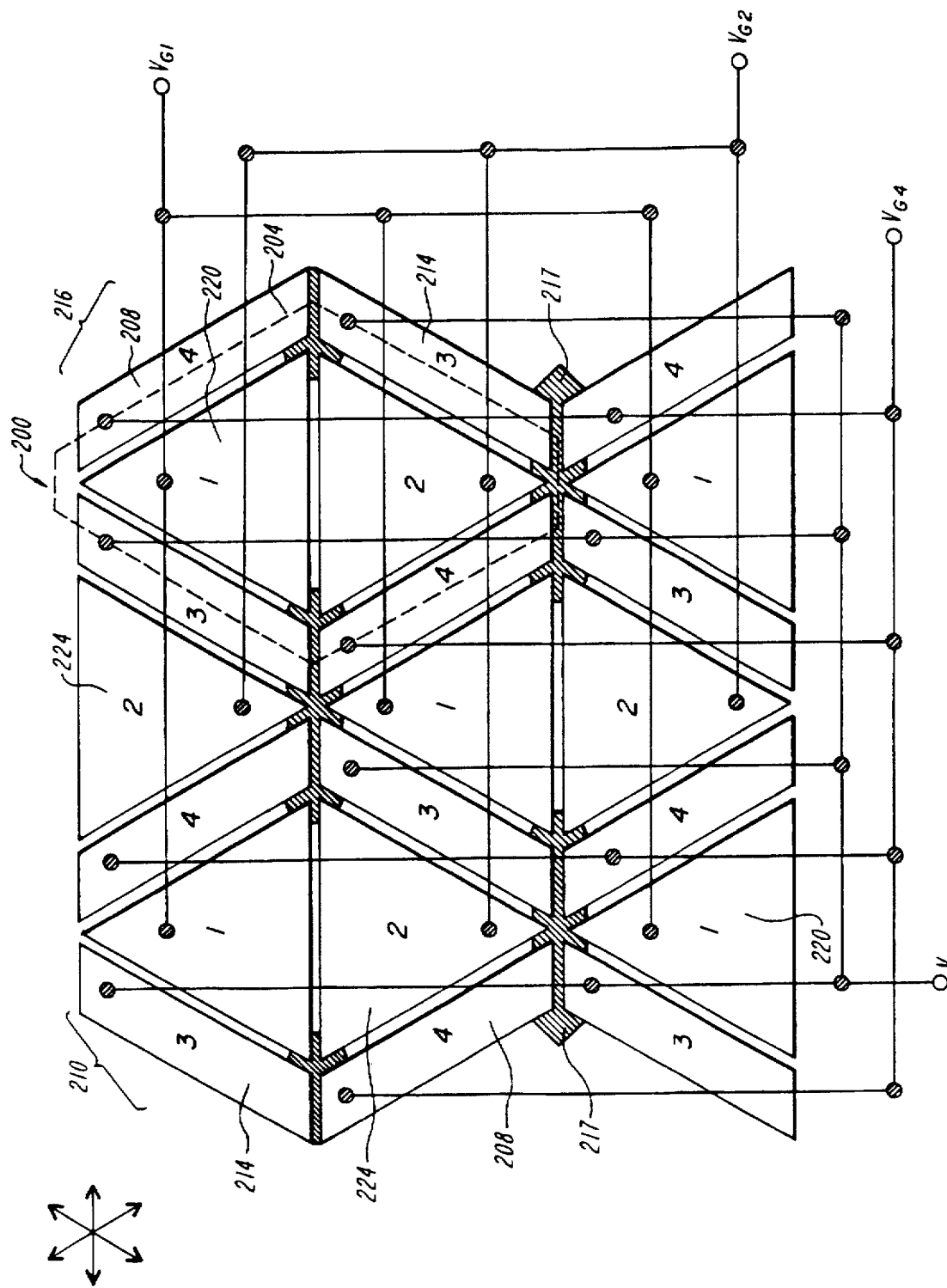
Figure 10A:
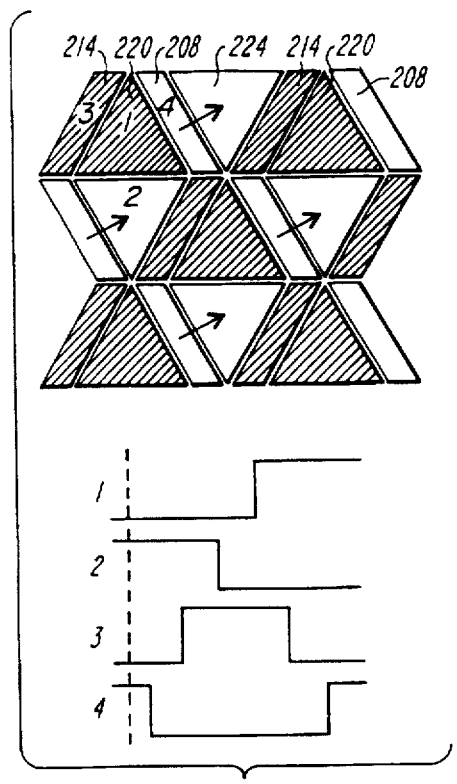
Figure 10B:
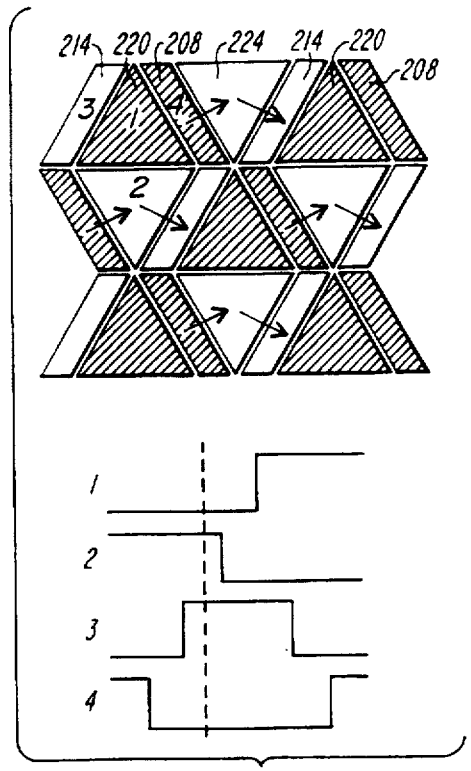
Figure 10C:
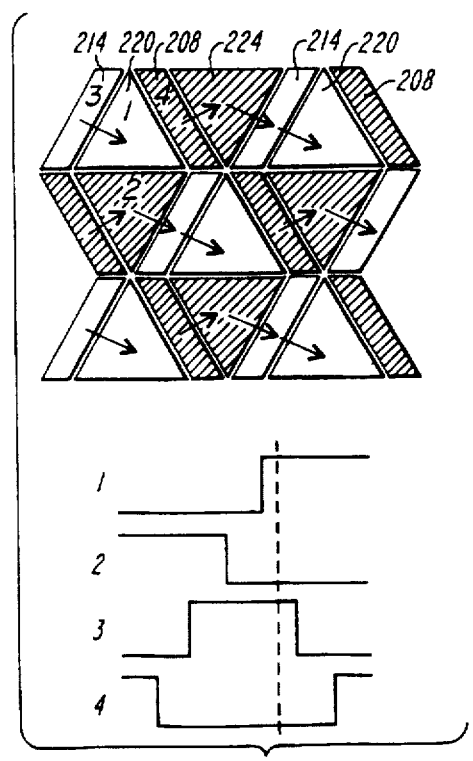
Figure 10D:
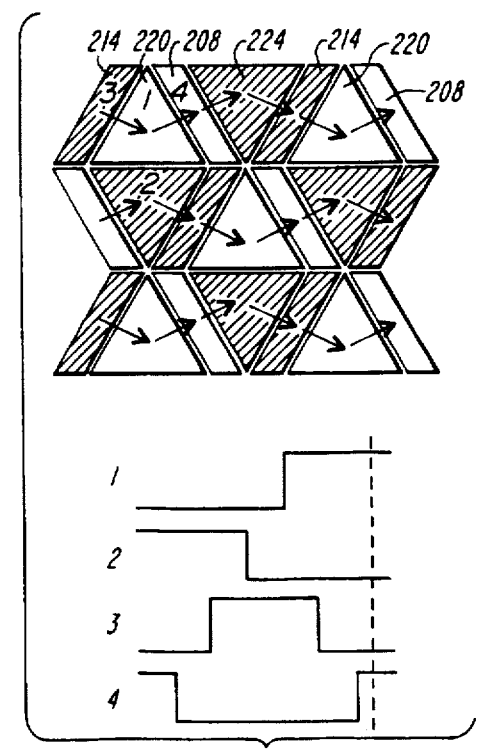
Figure 11:
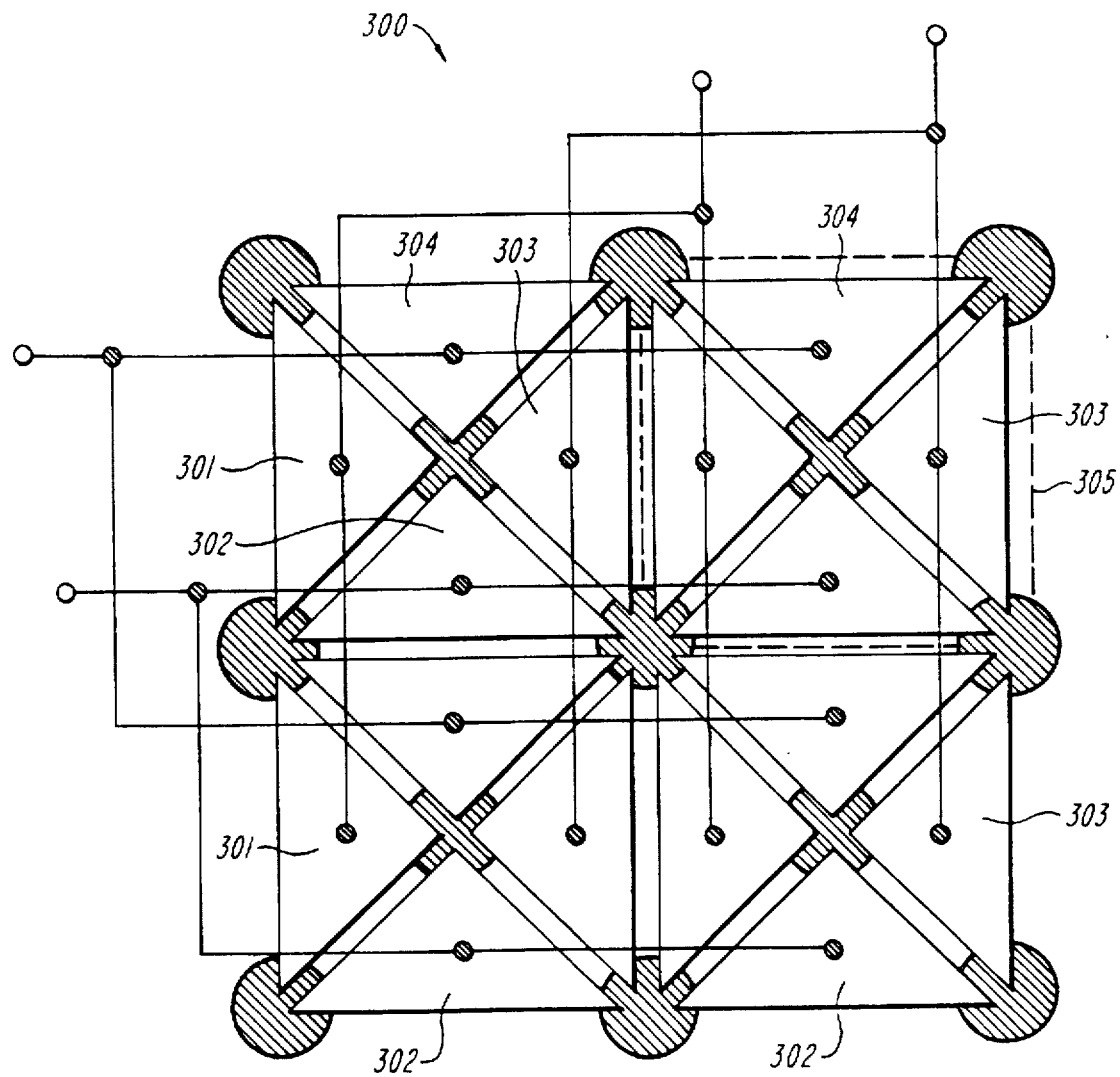
Figure 12A:
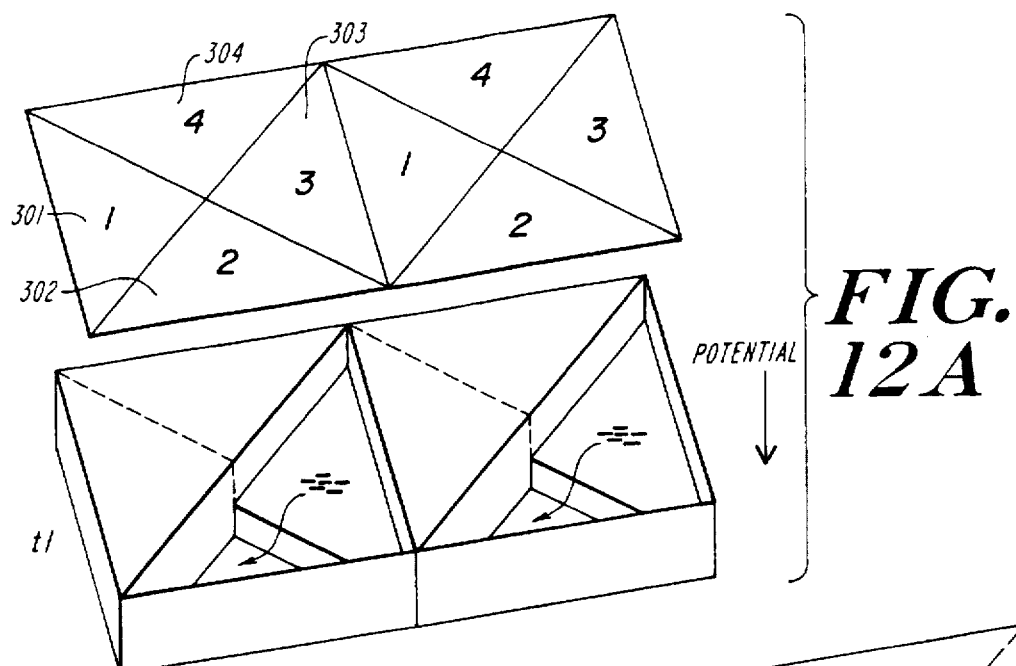
Figure 12B:
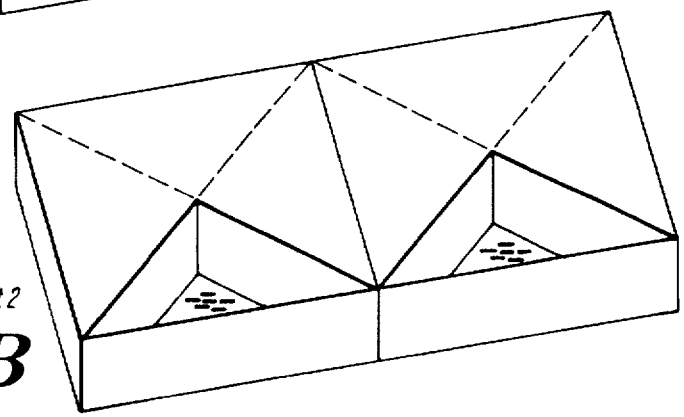
Figure 12C:
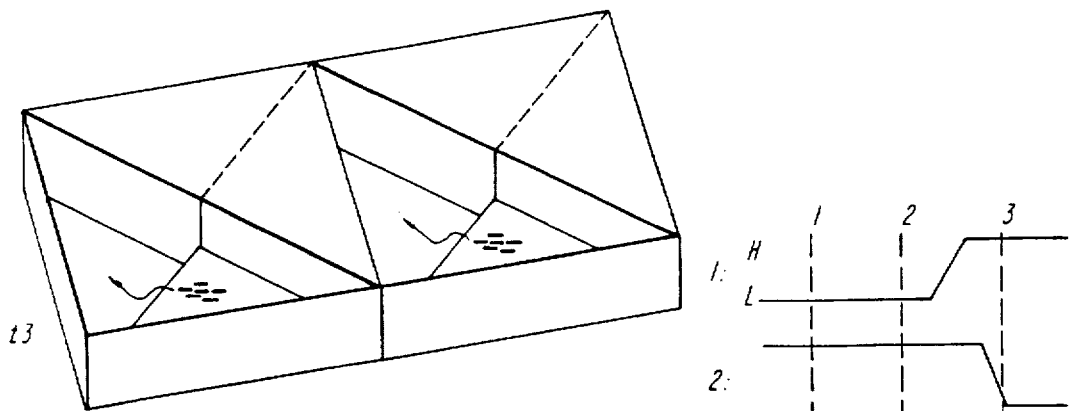
Figure 12D:
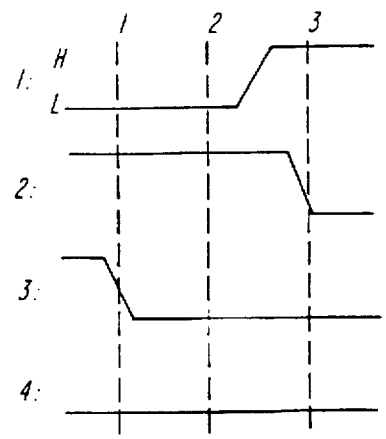
Figure 13A:
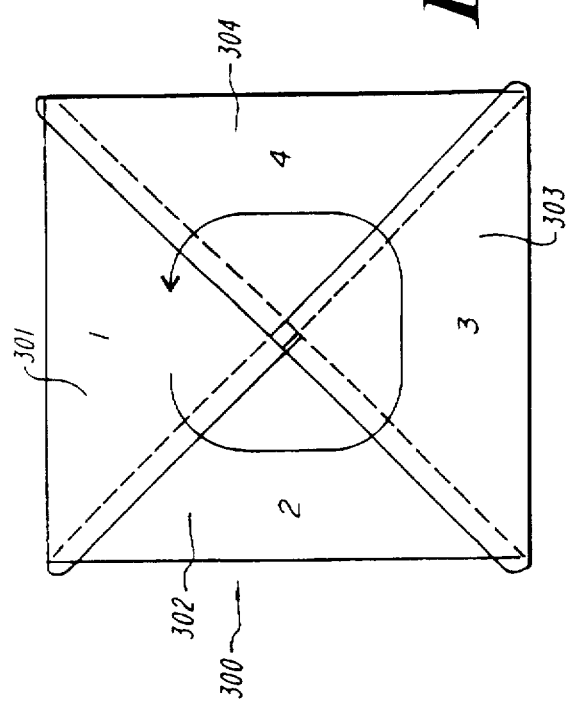
Figure 13B:
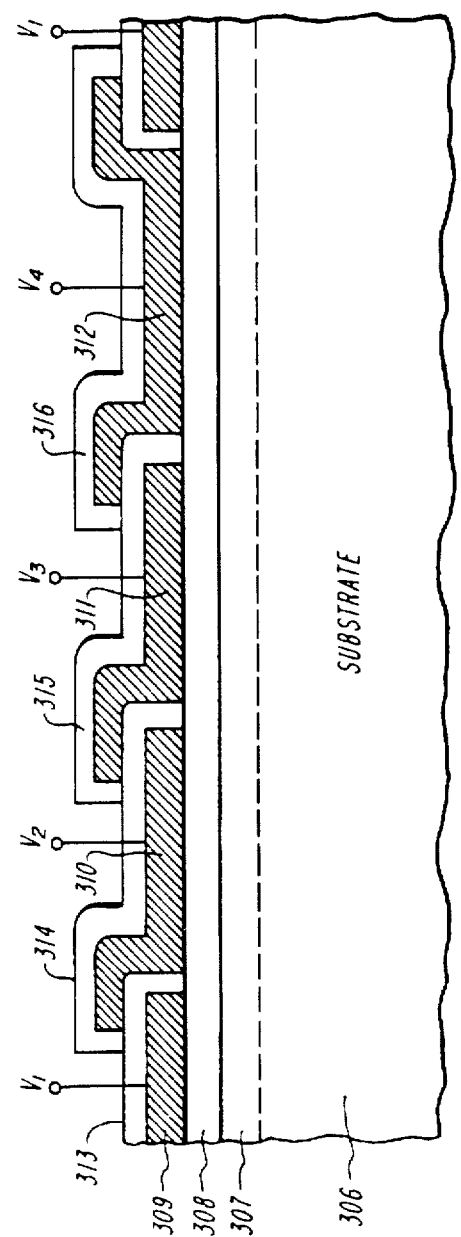
Figure 14A:
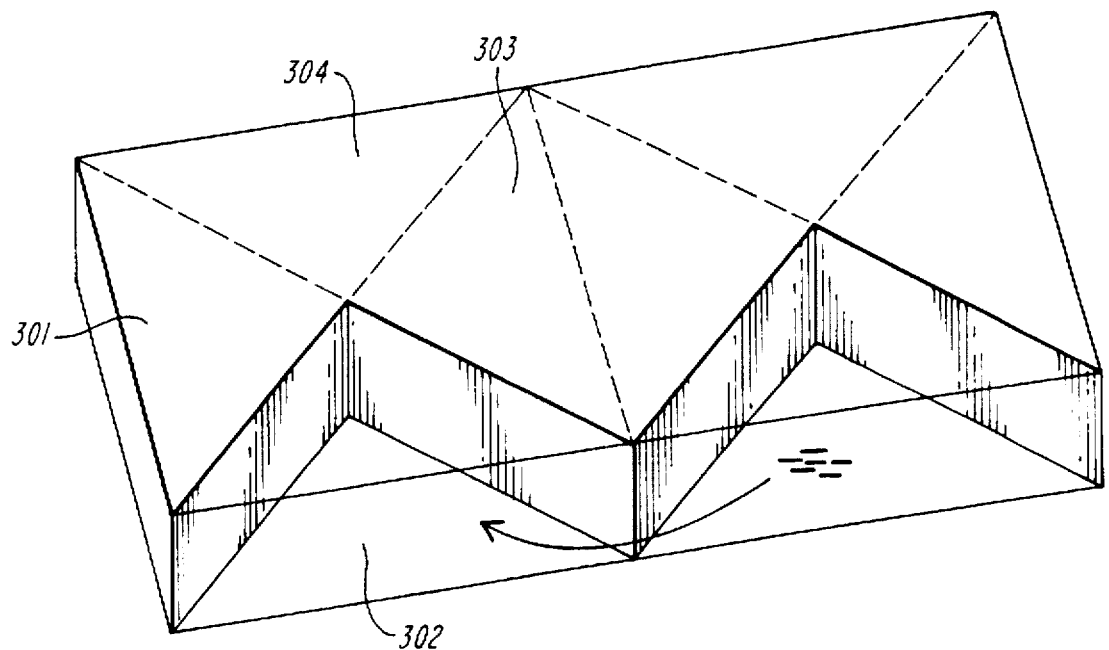
Figure 14B:
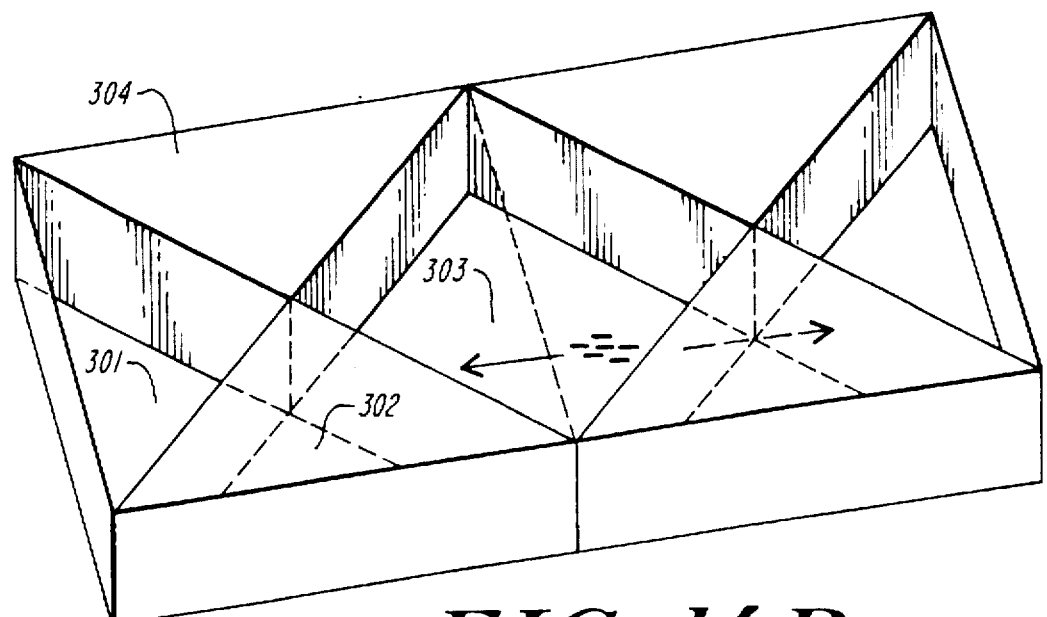
Figure 15A:
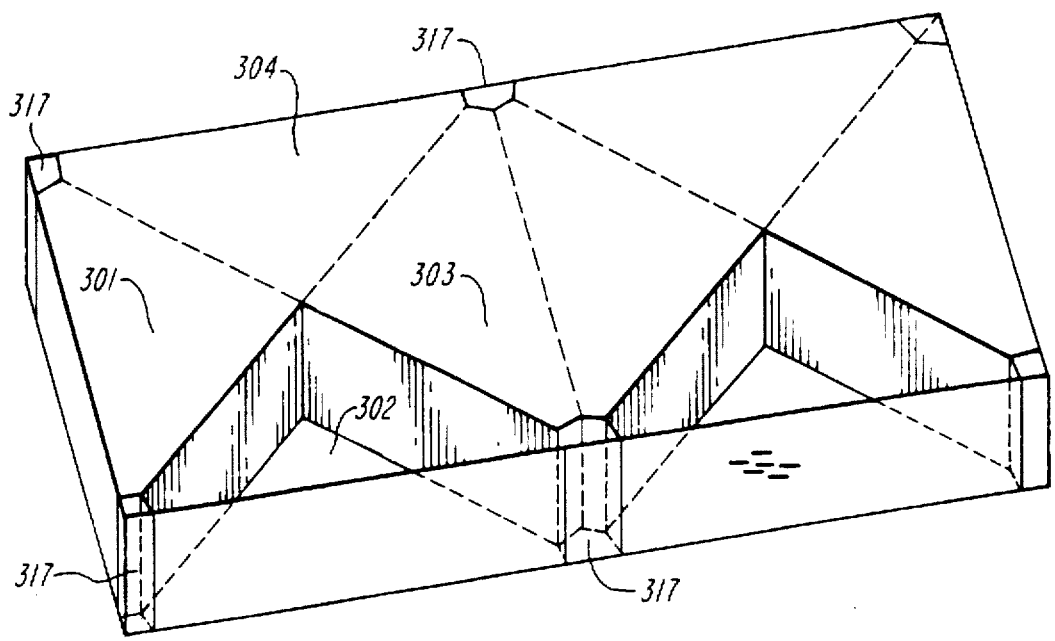
Figure 15B:
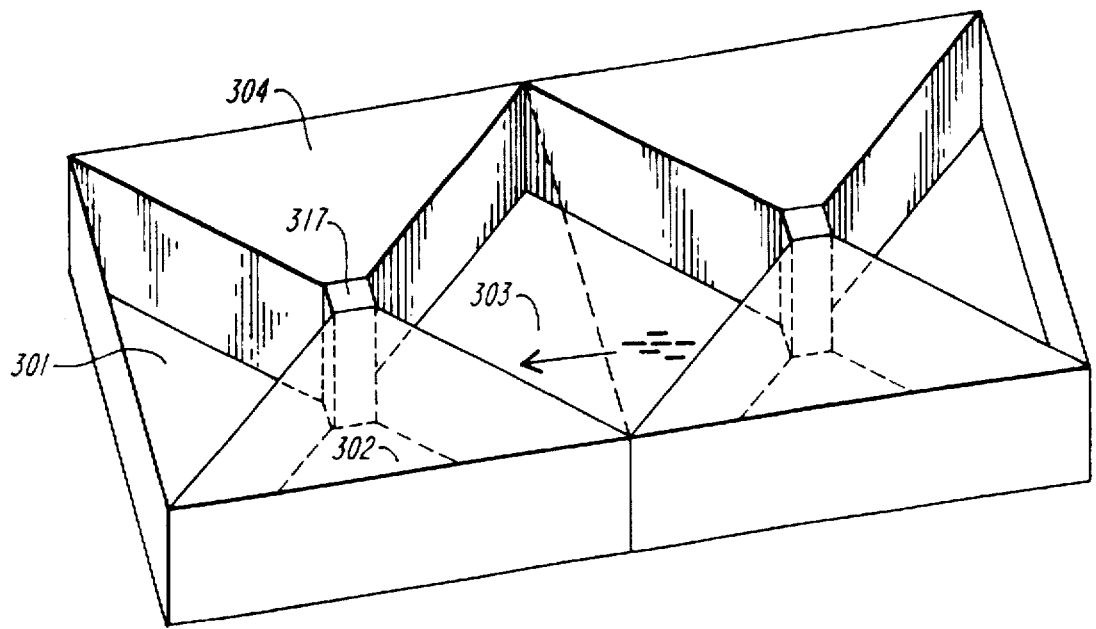
Figure 16B:
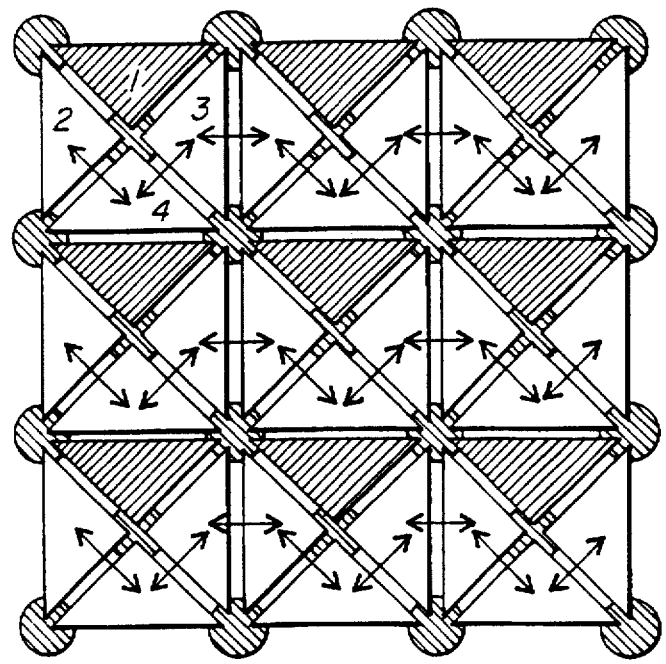
Figure 16A:
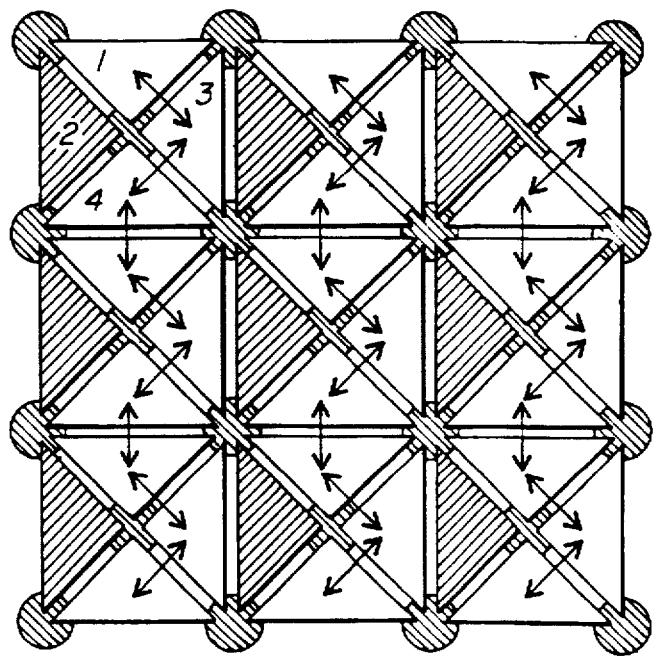
Figure 17A:
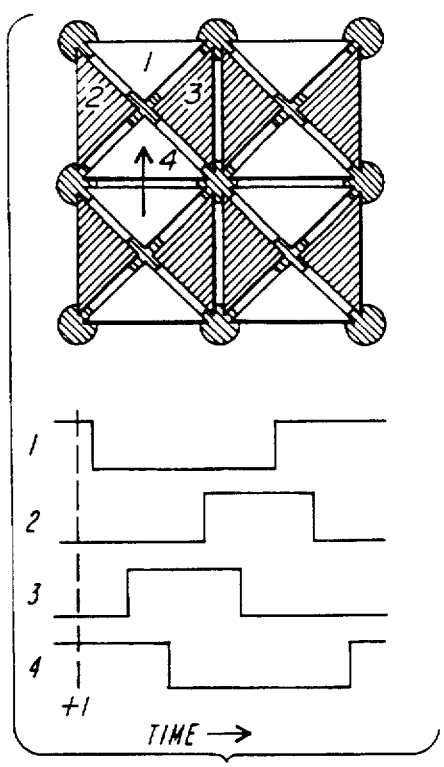
Figure 17B:
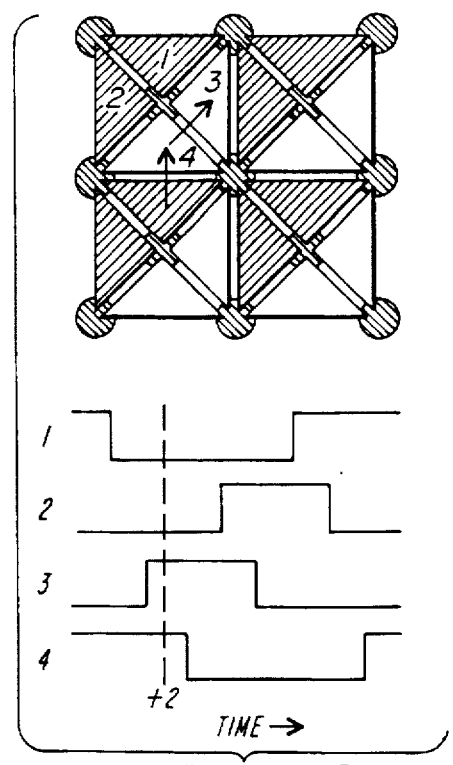
Figure 17C:
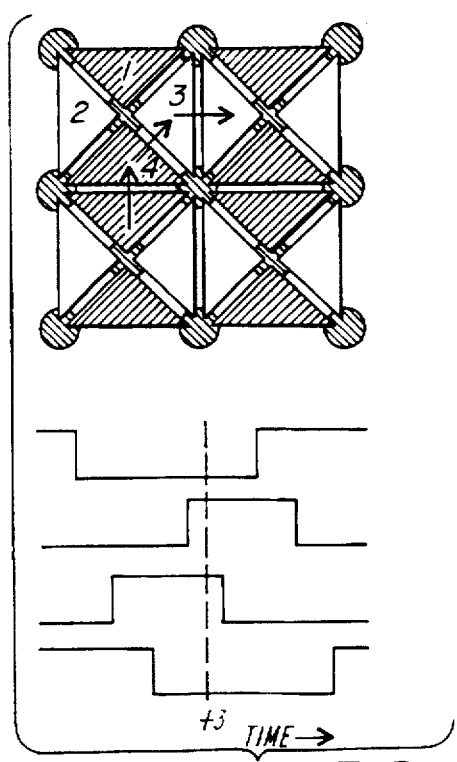
Figure 17D:
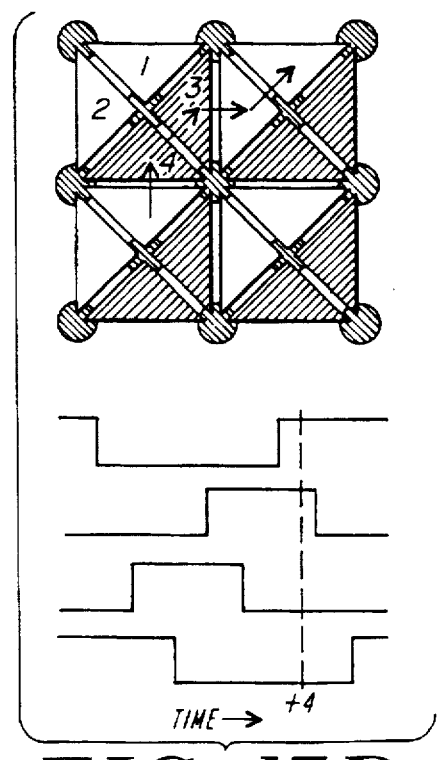

FIG. 8 shows an operational block diagram of an alternative embodiment of a multidirectional CCD in accordance with the present invention;

FIGS. 9A, 9B and 10A–10D show exemplary charge transfer clocking schemes for the CCD of FIG. 8;

FIG. 11 shows an operational block diagram of an additional alternative embodiment of a multidirectional CCD in accordance with the present invention;

FIGS. 12A–12D show a 3D diagrammatic representation of the potential wells and charge transfer for the CCD of FIG. 11 with a predetermined clocking scheme;

FIGS. 13A–B illustrate both a top plan view and a cross-section view along line A—A, respectively, of the CCD of FIG. 11;

FIGS. 14A and 14B show 3D diagrammatic representations of charge transfer within the CCD of FIG. 11, which illustrates the necessity of channel stops;

FIGS. 15A and 15B show 3D diagrammatic representations of charge transfer within the CCD of FIG. 11, which illustrates the use and advantages of channel stops;

FIGS. 16A and 16B respectively illustrate in diagrammatic form how the CCD of FIG. 11 is used to clock charge in horizontal and vertical directions; and FIGS. 17A–17D show in diagrammatic form how the CCD of FIG. 11 can be clocked to transfer charge along the 45° diagonals with a predetermined timing diagram.

DETAILED DESCRIPTION OF THE ILLUSTRATED EMBODIMENTS

Figure 1:
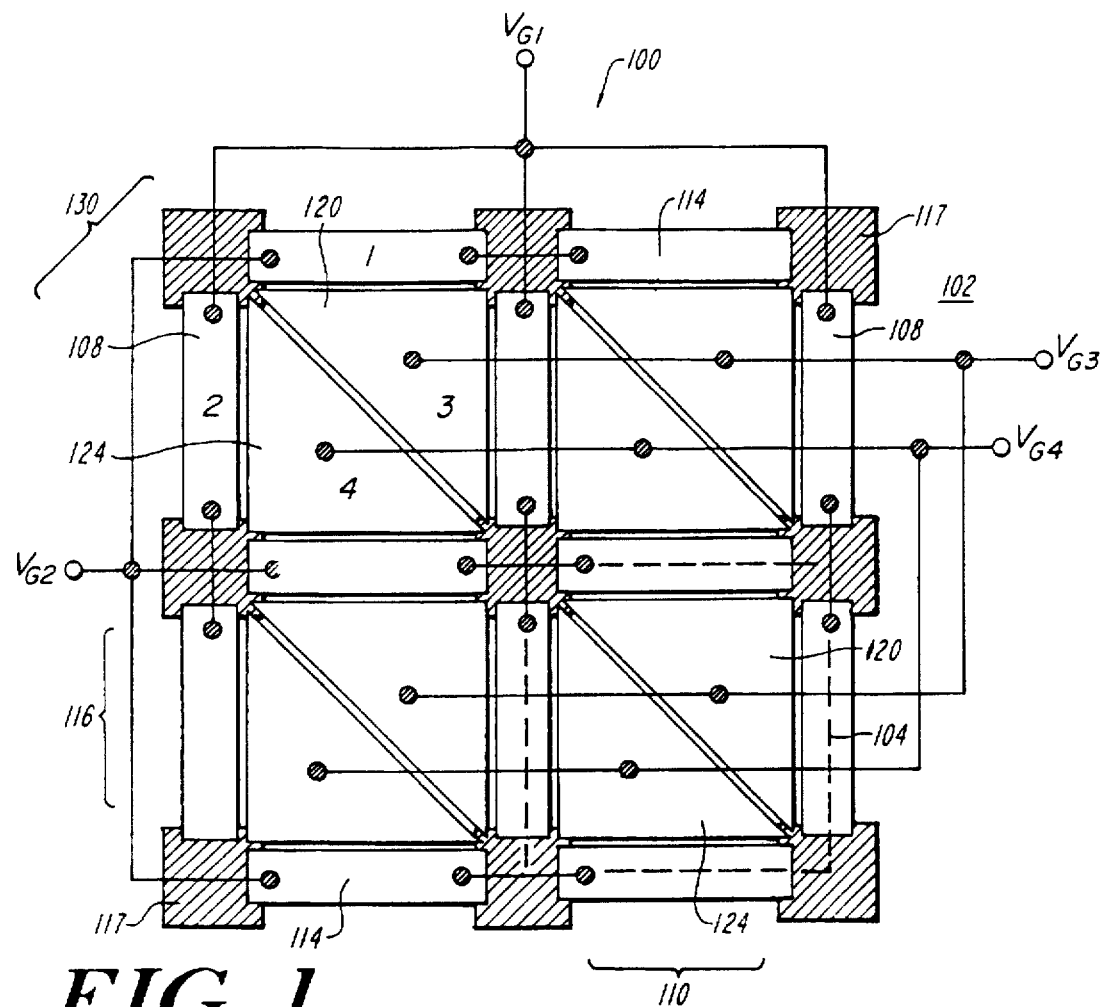
FIG. 1 shows an operational block diagram of a multidirectional transfer CCD in accordance with the present invention.
Figure 2:
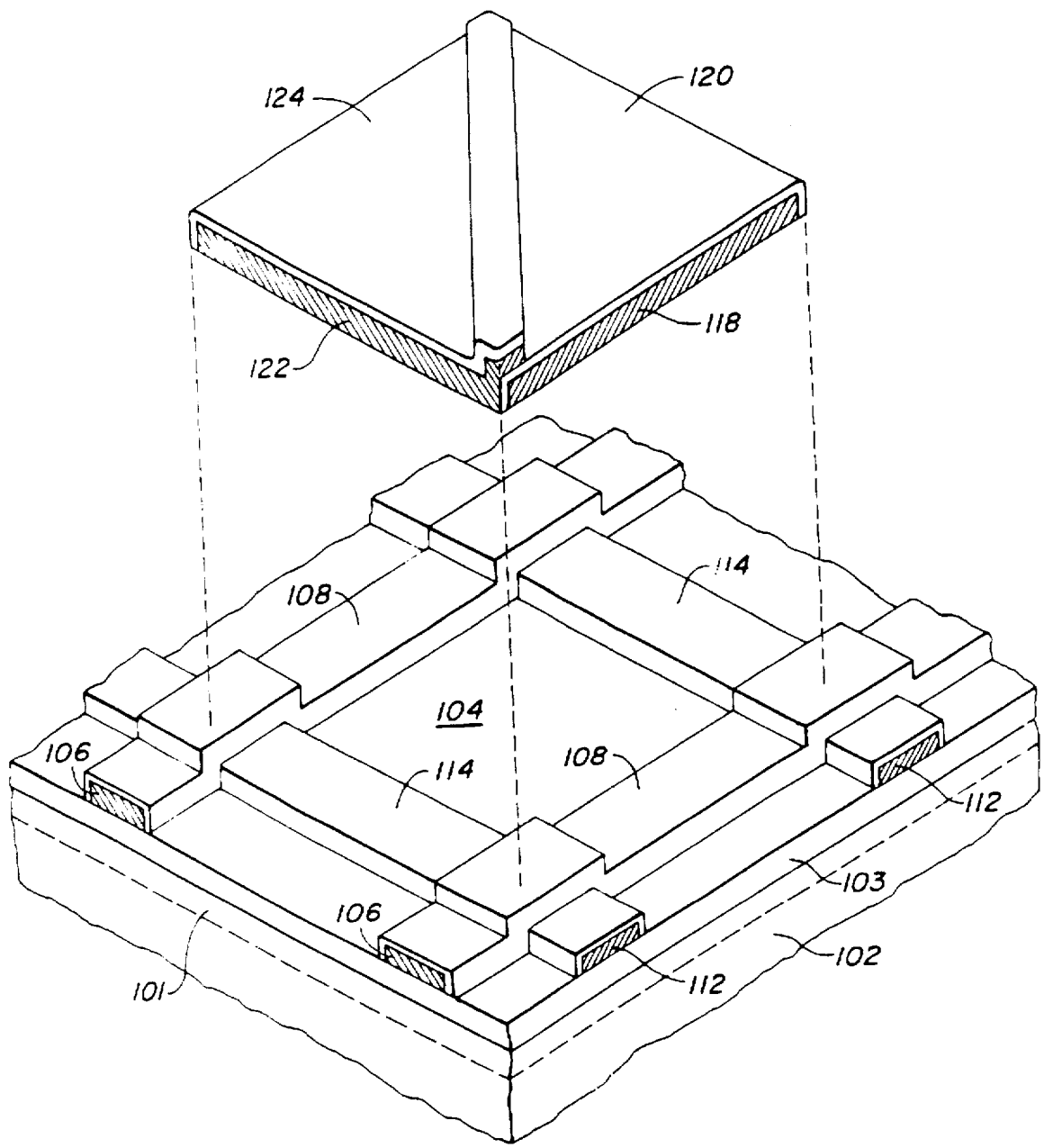
FIG. 2 shows a cutaway perspective view of a portion of the CCD shown in FIG. 1.

With reference now to FIGS. 1 and 2, a multidirectional transfer CCD 100 in accordance with the present invention is shown. The CCD 100 is configured within a charge storage medium, such as a semiconductor substrate 102 having an insulator layer 103 and a buried channel 101. The substrate is, for example, silicon in which case the insulator layer is typically $SiO_2$ or a combination of $SiO_2$ and $Si_3N_4$. The total thickness of this layer is typically 50–100 nm. The CCD of the present invention includes an array of charge transfer unit cells 104. A given cell 104 is defined by four separate gate levels, or phases.

The gate, or electrode, layers are then deposited and defined by standard photolithographic and etching processes. In the process used to construct the present invention, which is common to virtually every CCD manufacturer, a layer of polycrystalline silicon (polysilicon) 106 is deposited and doped with an impurity such as boron or phosphorus to render it conducting. The doping may be accomplished either during deposition or in a subsequent step. The gates are then defined in this layer by standard photolithoghraphic and etching steps. To insulate the gate electrodes on this layer from those on later layers, the polysilicon is oxidized so as to cover its exposed areas with an insulating film of $SiO_2$ to form the gates 108. The remaining three levels of polysilicon 112, 118, 122 and their associated gate electrode patterns 114, 120, 124 are produced in the same manner.

Accordingly, the CCD 100 includes a plurality of parallel first gates 108 extending in a first direction. For purposes of illustration, the first direction will be referred to as the vertical direction. The plurality of first gates defines therebetween a series of first bidirectional channels 110 which accommodate charge transfer in the charge storage medium along the first direction.

The CCD is also constructed to include a plurality of parallel second gates 114 extending in a second direction. The second direction is noncollinear with the first direction, preferably orthogonal. For purposes of illustration, the second direction will be referred to as the horizontal direction. The plurality of second gates defines therebetween a series of second bidirectional channels 116 which accommodates charge transfer in the charge storage medium along the second direction.

The first 108 and second 114 plurality of parallel gates overlap one another in order to form the matrix array of cells 104, which serve as charge storage regions within the first 110 and second 116 bidirectional channels. FIG. 2, for example, shows a configuration where gates 108 overlap gates 114. As shown in the topology illustrated in FIG. 1, each cell 104 is bounded horizontally by two of the plurality of vertically arranged first gates 108. A first common bias potential $V_{G1}$ is applied to all of the first gates 108 in accordance with a selected timing sequence. The cells 104 are bounded vertically by two of the plurality of horizontally arranged second gates 114. A second common bias potential $V_{G2}$ is applied to all of the second gates in accordance with the selected timing sequence. In addition, channel stops 117 are required at each intersection of the first 108 and second 114 gates. The channel stops are, for example, of conventional construction such as LOCOS. Further detailed description of the channel stops will be presented hereinafter with reference to FIGS. 14 and 15.

The polysilicon layer 118 is constructed with a third conductive pattern including a plurality of third gates 120, each of which is arranged in a first portion of each cell 104. The fourth layer 122 is constructed to include a plurality of fourth gates 124, each of which is arranged in a second portion of each cell. The fourth layer 122 can be either polysilicon or metal. Although polysilicon is the preferred material for the gate electrodes, it is by no means the sole choice. In a prototype device in accordance with the present invention, aluminum was used for the fourth level because there was no fourth polysilicon layer in the fabrication sequence utilized. This was possible because the fourth level need not have an insulating film over its exposed surface (no gate levels lie above it). It will be appreciated by those of skill in the art that the gates could be fabricated on the same, rather than different, levels.

In the illustrated embodiment, the third and fourth gates are configured as juxtaposed triangular shaped gates. Third and fourth common bias potentials, $V_{G3}$ and $V_{G4}$, respectively, are applied to the third and fourth gates in accordance with the selected timing sequence.

Figure 3A:
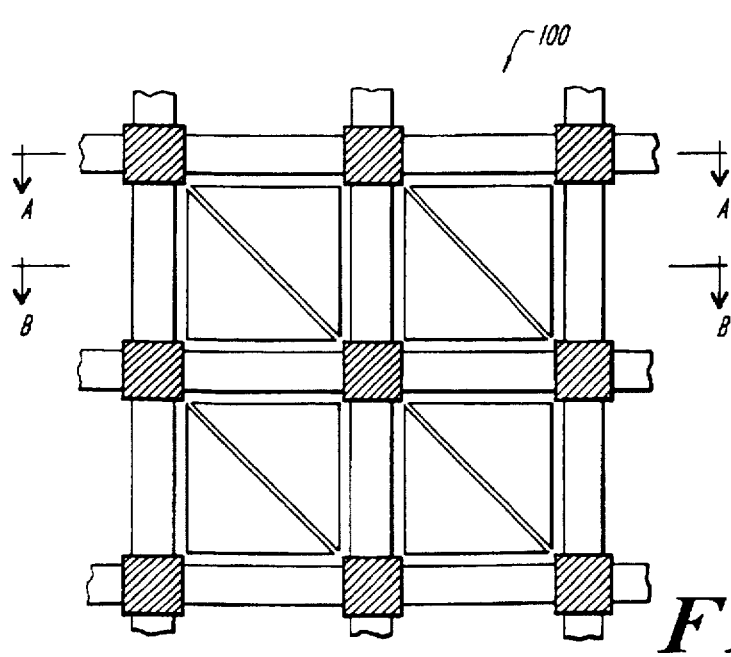
FIG. 3A shows a top plan view of the CCD shown in FIG. 1.
Figure 3B:
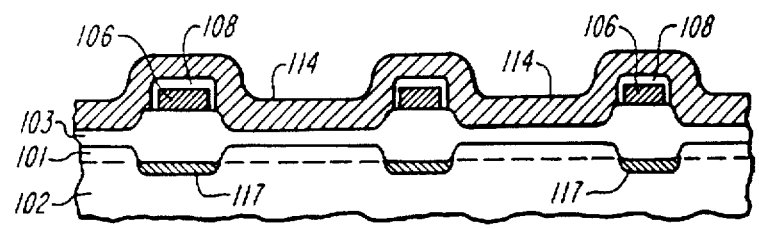
FIGS. 3B and 3C respectively show cross-section view of FIG. 3A taken along lines A—A and B—B.
Figure 3C:
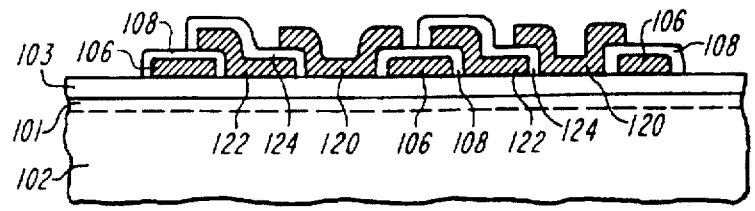
Figure 4A:
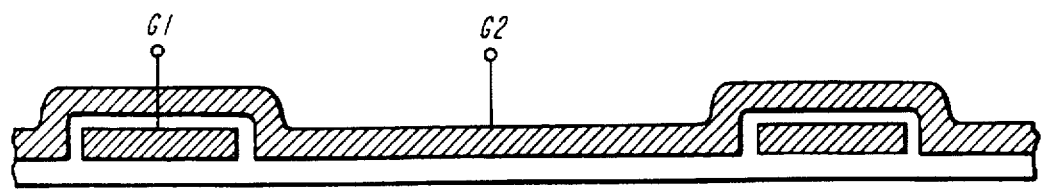
FIGS. 4A–4F show the potential profile for an n-channel device along the two reference lines A—A and B—B of FIG. 3A, and illustrate how charge is clocked in a three-phase device.
Figure 4B:
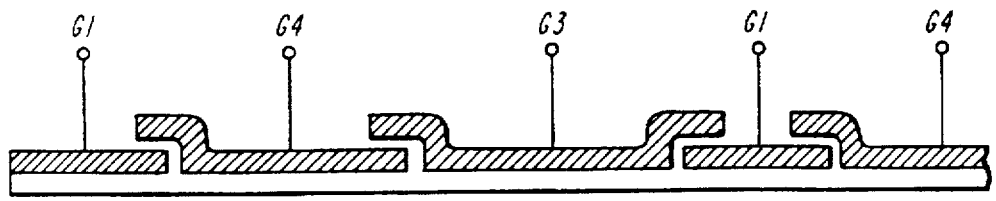
Figure 4C:
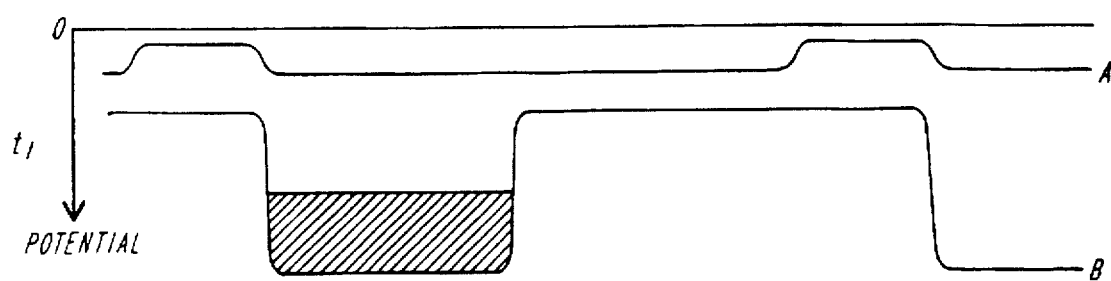
Figure 4D:
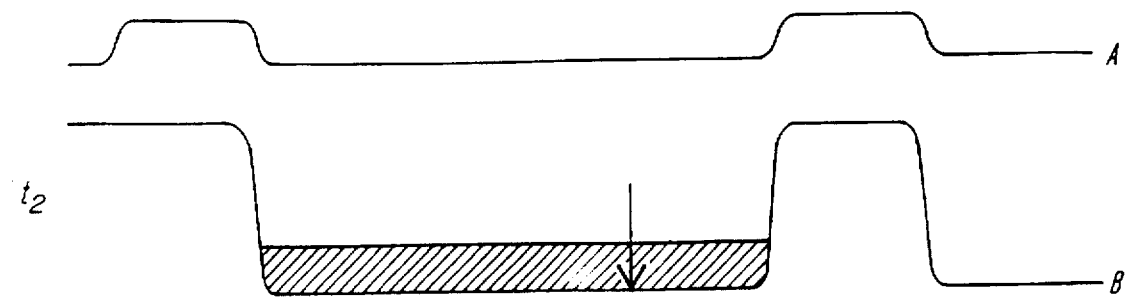
Figure 4E:
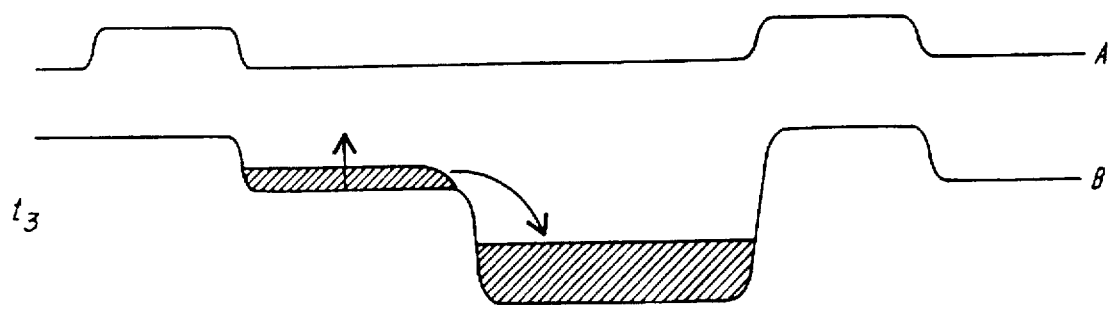
Figure 4F:
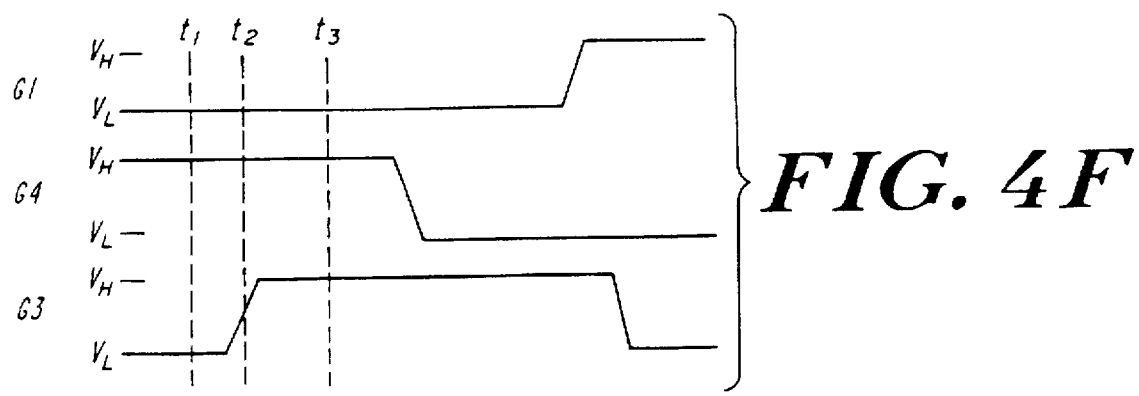

FIGS. 3A–3C illustrate further details regarding the CCD structure 100 in accordance with the present invention. FIG. 3B shows a cross-section of FIG. 3A taken along line A—A, while FIG. 3C shows a cross-section of FIG. 3A taken along line B—B. FIG. 3A illustrates the channel stop 117. The chanstop, as it is often called, is a barrier to the carrier flow in a CCD and can be implemented in a variety of ways. In common practice it consists of a thicker insulating layer of $SiO_2$, perhaps 500–1000 nm thick, combined with a doped region in the semiconductor. For an n-channel CCD the doped region would be p+. It is possible to omit the thicker oxide and rely on the doping alone.

FIGS. 4A–4F depict the potential profile for an n-channel device along the two reference lines A—A and B—B of FIG. 3A, and illustrate how charge is clocked in a three-phase device. It will be appreciated that the potential along A-A is kept low by the channel stop under gate 108 (G1) and by the low voltage applied to gate 114 (G2). This confines the charge to the channel 116 along B—B. Of course, the same potential diagram holds true for this structure when rotated 90° so as to propagate charge along channel 110.

In an exemplary operational timing sequence, the first gates 108 are biased low to act as a vertical channel stop, while the second 114, third 120 and fourth 124 gates are clocked in a conventional three-phase manner to transfer charge in the vertical direction. Alternatively, the second gates 114 are biased low and gates 108, 120, and 124 are clocked in a conventional three-phase manner in order to transfer charge in the horizontal direction. With reference to FIGS. 5A and 5B respectively show diagrammatic clocking representations of charge movement along the vertical bidirectional channel 110 and the horizontal bidirectional channel 116. It will be appreciated that the illustrated shaded gates are held at a low or blocking potential, while the unshaded gates are clocked to transfer charge.

FIGS. 5C–5F show diagrammatic clocking representations and associated timing diagrams for the CCD 100 in clocking the charge along a third bidirectional channel 130 which is configured at a 45° diagonal.

FIG. 6 shows a photomicrograph of a portion of an multidirectional transfer CCD of the present invention as implemented in an exemplary pixel cell array from the imaging section of a prototypical 64×64-pixel frame-transfer imager. The first 108, second 114 and third 120 gates are fabricated from three polysilicon levels, while the fourth gate 124 is fabricated from one metal level, for example, aluminum. The exemplary pixel cell dimensions are 27×27 µm. A more desirable alternative to aluminum is a fourth level of polysilicon due to the tendency of aluminum to short through thin gate dielectric layers.

The prototypical device has been tested with an optical input to demonstrate the multidirectional shifting capability.

FIG. 7 shows a photograph which illustrates the imaging results on one such test in which a laser was focused within a pixel cell near the center of the imaging array. The laser wavelength was 543 nm. and the device was at room temperature. The CCD clocks were then driven to clock the charge along the closest approximation to one cycle of the curve described by the equation:

$$x = k\{2\cos(t) + 3\cos(2t)\}$$

$$y = k\{2\sin(t) - 3\sin(2t)\} \quad 0 < t < 2\pi$$

where k is an arbitrary scaling factor. In this example, the clock period for transferring by one pixel was 5.0 μs and for integration on the light spot 500 μs. After the curve was completed, the charge was quickly shifted to an associated frame store and read out device. The charge-transfer inefficiency appears to be below $10^{-4}$ per pixel. A more precise number could not be obtained because of the relatively limited number of transfers and because the relatively high room-temperature dark current of about 1.4 nA/cm² (due in part to the use of non-inverted clocking) produced a background charge of about 1000 e⁻/pixel which acted as a "slim zero" and masked small charge losses.

With reference now to FIG. 8, an alternative embodiment of a multidirectional CCD 200 in accordance with the present invention is shown. The CCD 200 is a modified version of CCD 100 in that an array of charge transfer unit cells 204 are defined by four separate gate levels, or phases, two of which are configured as parallelograms rather than squares as in FIG. 1. It will be appreciated by those of skill in the art that the gates could be fabricated on the same, rather than different, levels.

Accordingly, the CCD 200 includes a plurality of parallel first gates 208 extending in a first direction. The plurality of first gates define therebetween a series of first bidirectional channels 210 which accommodate charge transfer in the charge storage medium along the first direction.

The CCD is also constructed to include a plurality of parallel second gates 214 extending in a second direction. The second direction is noncollinear with the first direction. The plurality of second gates define therebetween a series of second bidirectional channels 216 which accommodate charge transfer in the charge storage medium along the second direction.

The first 208 and second 214 plurality of parallel gates overlap one another in order to form the matrix array of cells 204, which serve as charge storage regions within the first 210 and second 216 bidirectional channels. As shown in the topology illustrated in FIG. 8, each cell 204 is bounded on one side by two of the plurality of vertically arranged first gates 208. A first common bias potential $V_{G4}$ is applied to all of the first gates 208 in accordance with a selected timing sequence. The cells 204 are bounded on the other side by two of the plurality of horizontally arranged second gates 214. A second common bias potential $V_{G3}$ is applied to all of the second gates in accordance with the selected timing sequence. In addition, channels stops 217 are required at each intersection of the first 208 and second 214 gates.

The CCD is constructed with a third conductive pattern including a plurality of third gates 220, each of which is arranged in a first portion of each cell 204. The fourth layer is constructed to include a plurality of fourth gates 224, each of which is arranged in a second portion of each cell.

In the illustrated embodiment, the third and fourth gates are configured as juxtaposed triangular shaped gates. Third and fourth common bias potentials, $V_{G2}$ and $V_{G1}$, respectively, are applied to the third and fourth gates in accordance with the selected timing sequence.

With reference to FIGS. 9A-B, it will be appreciated that biasing the gates 214 off, or gates 208 off will accommodate an operation in which charge is clocked in a three-phase manner as in FIG. 4, but along lines that are 60° apart. In addition, charge can be clocked in the horizontal direction, however, in this mode of operation, all four sets of gates must be sequentially clocked, and no level or set of gates is continuously biased off. Thus, charge is transferred in three directions, each 60° apart in the CCD 200. FIGS. 10A-10D show exemplary charge transfer clocking schemes for the CCD 200. It will be appreciated that the shaded gates are clocked with a low or blocking potential and the unshaded gates are intermittently clocked to transfer charge.

With reference now to FIG. 11, an additional alternative embodiment of a multidirectional CCD 300 in accordance with the present invention is shown. The CCD 300 is constructed as an array of charge transfer cells 305, each of which includes four gates 310, 302, 303, 304 with appropriate interconnections therebetween. The exemplary gates are triangular in shape in order to provide a more symmetric structure. It will be appreciated by those of skill in the art that the four gate electrodes can be constructed on either the same or different levels. If the gates are constructed on the same level, the gaps between the gates must be quite small, typically less than 0.5 μm.

The gate electrode levels can be biased to a dc voltage that repels the carriers, and therefore they can act as "electrical" channel stops. When gates 301 (or 303) are biased low, then gates 302, 303, and 304 (or gates 301, 302, and 304) can be clocked to transfer charge vertically. Likewise, by biasing gates 302 (OR 304) low, the charge transfer can be effected in the horizontal direction via gates 301, 303, and 304 (or gates 301, 302, and 303).

FIGS. 12A-D show a 3D diagrammatic representation of the potential wells and charge transfer for the CCD 300 with a predetermined clocking scheme over three time periods t1, t2 and t3. In this case the carriers are electrons, and the potential in the CCD well is positive downward, but the same applies to p-channel devices for which the carriers are holes and the potential would be positive upward. During t1, gates 301 and 304 are biased low, gates 302 are biased high, and gates 303 are biased midpoint between the high and low voltages. At time t2, gates 301, 303 and 304 are biased low, while gates 302 are biased high. Thus the charge is transferred from the wells of gates 303 to the wells of gates 302. Next, at time t3, gates 303 and 304 are biased low, gates 301 are biased high, and gates 302 are biased midpoint between the high and low voltages. Accordingly, the transfer of charge from gates 302 to gates 301 is initiated.

FIGS. 13A-B illustrate both a top plan view and a cross-section view along line A—A, respectively, of the CCD 300 as fabricated with a four-polysilicon process using overlapping gates as described in more detail with reference to FIGS. 1 and 2. For example, the CCD 300 includes a substrate 306 having a buried channel 307, and an insulator layer 308. Gates 301, 302, 303 and 304 respectively include polysilicon layer 309–312 and silicon dioxide layers 313–316. This embodiment is preferred to the single-level approach because it avoids the difficulties of defining the small gaps between gates.

FIGS. 14A and 14B show 3D diagrammatic representations of charge transfer within the CCD 300, which illustrates the necessity of channel stops. In FIG. 14A, the corners of wells associated with gate electrodes 302 in the high state are touching. If there are any deviations from the ideal structure in the fabrication, as would be expected, then a gap may open between adjacent wells and charge may leak from one well to the next. Another situation is shown in FIG. 14B, where gates 301 and 303 are biased high. Again, a tiny gap in electrical potential may exist between the wells of adjoining gates 303 and 301 allowing charge to leak backward instead of forward.

FIGS. 15A and 15B show 3D diagrammatic representations of charge transfer within the CCD 300, which illustrates how channel stops 317 positioned at all of the vertices of the gates will clamp the electrical potential to near zero, and therefore provide a constant barrier to charge irrespective of the voltages applied to any gates lying above them. FIGS. 15A and 15B respectively illustrate how channel stops 317 solve the corresponding isolation problem in FIGS. 14A and 14B. Channel stops are well known in the integrated-circuit art and can consist of selectively doped areas at the surface of the silicon substrate in combination with a thicker oxide insulating layer.

FIGS. 16A and 16B respectively illustrate in diagrammatic form how the CCD 300 is used to clock charge horizontally and vertically. It will be appreciated that the shaded gates are biased low, and therefore block charge and act as channel stops, while the unshaded gates are clocked in a conventional three-phase manner to pass charge in the directions illustrated by the bidirectional arrows. The clocking scheme and potential diagrams are similar to those described with reference to FIG. 4A–4F.

The higher degree of symmetry of this structure may mean that the motion of the charge collection well is more easily and more finely matched to the motion of an image. One example that illustrates this is to imagine tracking a spot of light moving in a clockwise circle within a pixel.

FIGS. 17A–17D show in diagrammatic form how the CCD 300 can be clocked to transfer charge along the 45° diagonals from time periods t1–t4 with a predetermined timing diagram. In contrast to the illustration in FIGS. 16A and 16B, all four gate levels are clocked. It will be appreciated that the gate potential (high/low) at each step in the clocking cycle is indicated by shading or non-shading.

One potential application of the present invention is noiseless compensation for image motion. Commercial video cameras sometimes compensate for camera motion by registration of frames in software, but they work in the regime where the frame rate is fast compared to the motion. The multidirectional transfer CCD device of the present invention is useful in the opposite regime, where the image motion is fast compared to the integration time necessary to develop an image bright enough not to be dominated by read noise. In some satellites with imaging systems, a considerable amount of weight and cost is associated with attitude control systems that are needed to stabilize an image to within a pixel. Lighter, less expensive systems that are capable of much less stabilization could be used in conjunction with the present invention. In this case, an inertial measurement system would provide the information on the spacecraft motion needed to clock the device and maintain registration between the image and the charge packets.

A primary motivation, however, is to improve the resolution of ground-based astronomical imaging. Atmospheric turbulence produces random phase distortions in the optical wavefront which severely degrade the image resolution to well below the diffraction limit of large telescopes. Much of the distortion manifests itself as a tilt in the wavefront, and this in turn leads to a translation of the image at the focal plane. Conventional adaptive-optics systems compensate for this lowest-order distortion by using a fast tip-tilt mirror in the optical path. An multidirectional transfer CCD in accordance with the present invention can achieve this correction electronically by shifting the charge to maintain registration with the moving image. Mechanical resonances are a challenge for tip-tilt mirrors, but even a large multidirectional transfer CCD with resistive polysilicon gates can easily follow motions at a rate of 1 kHz.

As with other systems, the information on the image displacements must be independently measured and processed, usually with a high-frame-rate imager viewing a bright, nearby star or possibly using a fraction of the light from the object of interest, if it is bright enough. This light is picked off with a mirror or dichroic, and an amusing configuration is that the high-speed imager could be a front-side illuminated CCD which acts as the mechanical substrate for the thinned, back-illuminated multidirectional transfer CCD. Most of the near infrared light passes through a thinned CCD and would be available for the imaging detector behind.

The foregoing description has been set forth to illustrate the invention and is not intended to be limiting. Since modifications of the described embodiments incorporating the spirit and substance of the invention may occur to persons skilled in the art, the scope of the invention should be limited solely with reference to the appended claims and equivalents thereof.

We claim:

1. A multidirectional charge transfer device configured in a charge storage medium, said device comprising:
   an array of charge storage regions, each of said charge storage regions comprising:
      a plurality of first gates, each of which is arranged in a first portion of each charge storage region,
      a plurality of second gates, each of which is arranged in a second portion of each charge storage region,
      a plurality of third gates, each of which is arranged in a third portion of each charge storage region,
      a plurality of fourth gates, each of which is arranged in a fourth portion of each charge storage region, wherein
      said plurality of gates and charge storage regions being configured to define at least three bidirectional charge transfer paths which are noncollinear with respect to each other; and
   means for sequentially biasing said plurality of gates to establish charge transfer along one of said bidirectional charge transfer paths and forming blocking potentials to charge transfer in the remaining charge transfer paths.

2. The device of claim 1 further comprising potential blocking regions disposed at intersections of any three gates of said plurality of first, second, third and fourth gates.

3. The device of claim 1, wherein said plurality of gates and charge storage regions are configured to define at least four bidirectional charge transfer paths which are noncollinear with respect to each other.

4. The device of claim 1, wherein said first, second, third and fourth gates are arranged so as to not overlap one another within said charge storage region.

5. The device of claim 1, wherein said first gates are arranged as first parallel gates extending in a direction corresponding to one of said bidirectional charge transfer paths.

6. The device of claim 5, wherein said second gates are arranged as second parallel gates extending in direction corresponding to a another of said bidirectional charge transfer paths, said first and second plurality of parallel gates overlapping one another so as to form boundaries for each of said array charge storage regions.

7. The device of claim 6, wherein said third and fourth gates for each charge storage region are arranged within the boundaries formed by adjacent sets of said first and second gates.

8. The device of claim 1, wherein one or more of each of said first, second, third and fourth gates are configured on the same layer.

9. The device of claim 1, wherein one or more of each of said first, second, third and fourth gates are configured on different layers.

10. A multidirectional charge coupled device configured in a charge storage medium, said device comprising:

- a first conductive pattern including a plurality of parallel first gates extending in a first direction to form therebetween a series of first bidirectional channels which accommodate charge transfer in said charge storage medium along said first direction;
- a second conductive pattern including a plurality of parallel second gates extending in a second direction which is noncollinear with said first direction to form therebetween a series of second bidirectional channels which accommodate charge transfer in said charge storage medium along said second direction, said plurality of parallel first and second gates overlap one another so as to form a matrix of charge storage regions in said first and second directional channels;
- a third conductive pattern including a plurality of gates, each of which is arranged in a first portion of each charge storage region;
- a fourth conductive pattern including a plurality of fourth gates, each of which is arranged in a second portion of each charge storage region, said first, second, third and fourth gates being arranged in a third direction which is noncollinear with said first and second directions to form therebetween a series of at least three bidirectional channels which accommodate charge transfer in said charge storage medium along said third direction; and
- means for sequentially biasing said plurality of gates to establish charge transfer along one of said bidirectional channels and forming blocking potentials to charge transfer in the remaining channels.

11. The device of claim 10 further comprising channel stops disposed at intersections of any three gates of said plurality of first, second, third and fourth gates.

12. The device of claim 10, wherein said plurality of gates and charge storage regions are configured to define at least four bidirectional channels which are noncollinear with respect to each other.

13. The device of claim 10, wherein said first, second, third and fourth gates are arranged so as to not overlap one another within said charge storage region.

14. The device of claim 10, wherein one or more of each of said conductive patterns are configured on the same layer.

15. The device of claim 10, wherein one or more of each of said conductive patterns are configured on different layers.

16. A multidirectional charge coupled device configured in a charge storage medium, said device comprising:

- a first conductive pattern including a plurality of first gates;
- a second conductive pattern including a plurality of second gates;
- a third conductive pattern including a plurality of third gates;
- a fourth conductive pattern including a plurality of fourth gates, wherein said plurality of gates define an array of charge storage regions each respectively having a first, second, third and fourth gate, said plurality of gates and charge storage regions being configured to define at least four bidirectional charge transfer paths which are noncollinear with respect to each other; and
- means for sequentially biasing said plurality of gates to establish charge transfer along one of said bidirectional charge transfer paths and forming blocking potentials to charge transfer in the remaining charge transfer paths.

17. The device of claim 16 further comprising channel stops disposed at intersections of any three gates of said plurality of first, second, third and fourth gates.

18. The device of claim 16, wherein said first, second, third and fourth gates are arranged so as to not overlap one another within said charge storage region.

19. The device of claim 16, wherein one or more of each of said conductive patterns are configured on the same layer.

20. The device of claim 16, wherein one or more of each of said conductive patterns are configured on different layers.

* * * * *